United States Patent
Wang et al.

(10) Patent No.: US 11,087,846 B1
(45) Date of Patent: Aug. 10, 2021

(54) MEMORY SYSTEM WITH SINGLE DECODER, MULTIPLE MEMORY SETS AND METHOD FOR DECODING MULTIPLE CODEWORDS FROM MEMORY SETS USING THE SINGLE DECODER

(71) Applicant: SK hynix Inc., Gyeonggi-do (KR)

(72) Inventors: Haobo Wang, San Jose, CA (US); Fan Zhang, Fremont, CA (US); Hui-Chun Wu, Los Altos, CA (US); Jaeyoung Jang, Cupertino, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/788,989

(22) Filed: Feb. 12, 2020

(51) Int. Cl.
*G11C 16/08* (2006.01)
*G11C 16/32* (2006.01)
*G06F 3/06* (2006.01)
*G06F 11/10* (2006.01)

(52) U.S. Cl.
CPC .............. *G11C 16/08* (2013.01); *G06F 3/064* (2013.01); *G06F 3/0619* (2013.01); *G06F 3/0679* (2013.01); *G06F 11/1012* (2013.01); *G06F 11/1048* (2013.01); *G06F 11/1076* (2013.01); *G11C 16/32* (2013.01)

(58) Field of Classification Search
CPC ....... G11C 16/08; G11C 16/32; G06F 3/0619; G06F 3/0679; G06F 3/064; G06F 11/1012; G06F 11/1048; G06F 11/1076
See application file for complete search history.

(56) References Cited

U.S. PATENT DOCUMENTS

| | | | | |
|---|---|---|---|---|
| 7,577,891 B2 * | 8/2009 | Farjadrad | ........... | H03M 13/1102 714/752 |
| 8,862,965 B1 * | 10/2014 | Chaichanavong | ... | G11C 29/883 714/764 |
| 10,180,874 B2 | 1/2019 | Bazarsky et al. | | |
| 10,275,361 B2 | 4/2019 | Ish et al. | | |
| 10,411,024 B2 * | 9/2019 | Kanno | .............. | H01L 27/11524 |
| 10,817,218 B2 * | 10/2020 | Jo | ......... | G06F 3/0679 |
| 2009/0070656 A1 * | 3/2009 | Jo | ......... | G11C 7/1006 714/763 |
| 2015/0244397 A1 * | 8/2015 | Brown | .............. | H03M 13/3723 714/752 |
| 2017/0331500 A1 * | 11/2017 | Bhatia | ............... | H03M 13/3977 |
| 2019/0056992 A1 * | 2/2019 | Kim | ....................... | G06F 11/076 |
| 2019/0121696 A1 * | 4/2019 | Chen | ................... | G06F 12/0607 |
| 2020/0287656 A1 * | 9/2020 | Chu | .................... | H03M 13/1128 |

* cited by examiner

*Primary Examiner* — Mushfique Siddique
(74) *Attorney, Agent, or Firm* — IP & T Group LLP

(57) ABSTRACT

A memory system includes a memory device including memory sets and a controller including a decoder. The decoder receives multiple codewords from the memory sets and decodes the multiple codewords. The decoder determines an inter-set delay for a codeword of a select memory set. When the inter-set delay is greater than a maximum inter-set delay, the decoder determines a total decoding time based on an effective inter-set delay and an effective decoding time. The decoder outputs the decoded codeword at the end of the total decoding time.

16 Claims, 12 Drawing Sheets

MEMORY SYSTEM WITH SINGLE DECODER, MULTIPLE MEMORY SETS AND METHOD FOR DECODING MULTIPLE CODEWORDS FROM MEMORY SETS USING THE SINGLE DECODER

BACKGROUND

1. Field

Embodiments of the present disclosure relate to a decoding scheme in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). A memory system includes a decoder for decoding read data from a memory device. Alternatively, a memory system includes multiple decoders for decoding multiple codewords from a plurality of memory sets. Using multiple decoders results in more circuit area and more power consumption in the memory system. In this context, embodiments of the present invention arise.

SUMMARY

Aspects of the present invention include a memory system including a single decoder and a method for decoding multiple codewords from a plurality of memory sets using the single decoder.

In one aspect, a memory system includes a memory device including a plurality of memory sets and a controller including a decoder. The decoder receives multiple codewords from the plurality of memory sets and decodes the multiple codewords. The decoder determines an inter-set delay for a codeword of a select memory set. When the inter-set delay is greater than a maximum inter-set delay, the decoder determines a total decoding time based on an effective inter-set delay and an effective decoding latency. The decoder outputs the decoded codeword at the end of the total decoding time.

In another aspect, a method for operating a decoder includes: receiving multiple codewords from a plurality of memory sets; decoding the multiple codewords; determining an inter-set delay for a codeword of a select memory set; when the inter-set delay is greater than a maximum inter-set delay, determining a total decoding time based on an effective inter-set delay and an effective decoding latency; and outputting the decoded codeword at the end of the total decoding time.

Additional aspects of the present invention will become apparent from the following description.

DETAILED DESCRIPTION

Figure 1:
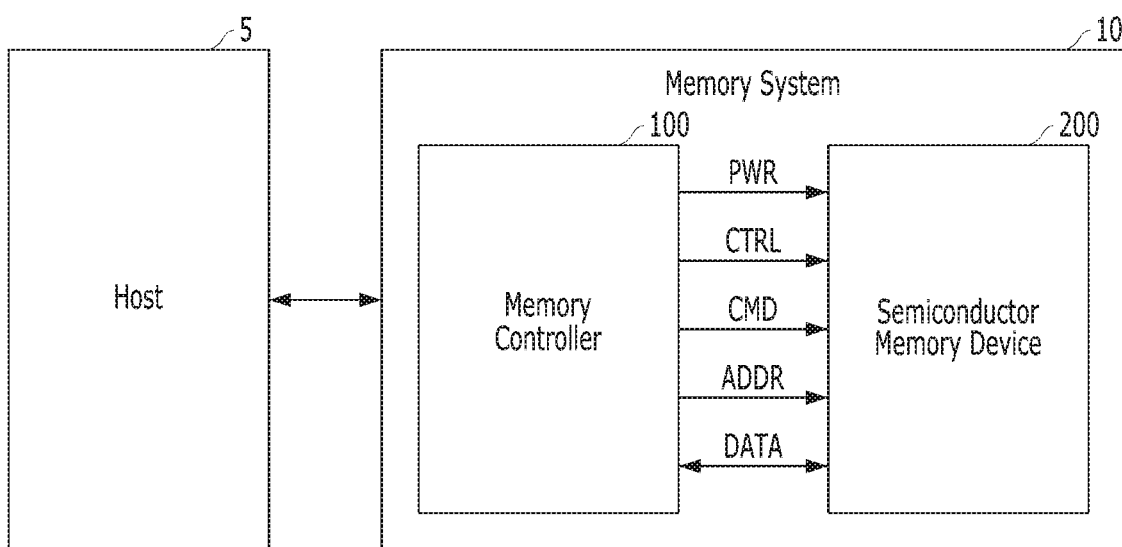
FIG. 1 is a block diagram illustrating a data processing system in accordance with an embodiment of the present invention.

Various embodiments are described below in more detail with reference to the accompanying drawings. The present invention may, however be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects is of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, is a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines.

The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
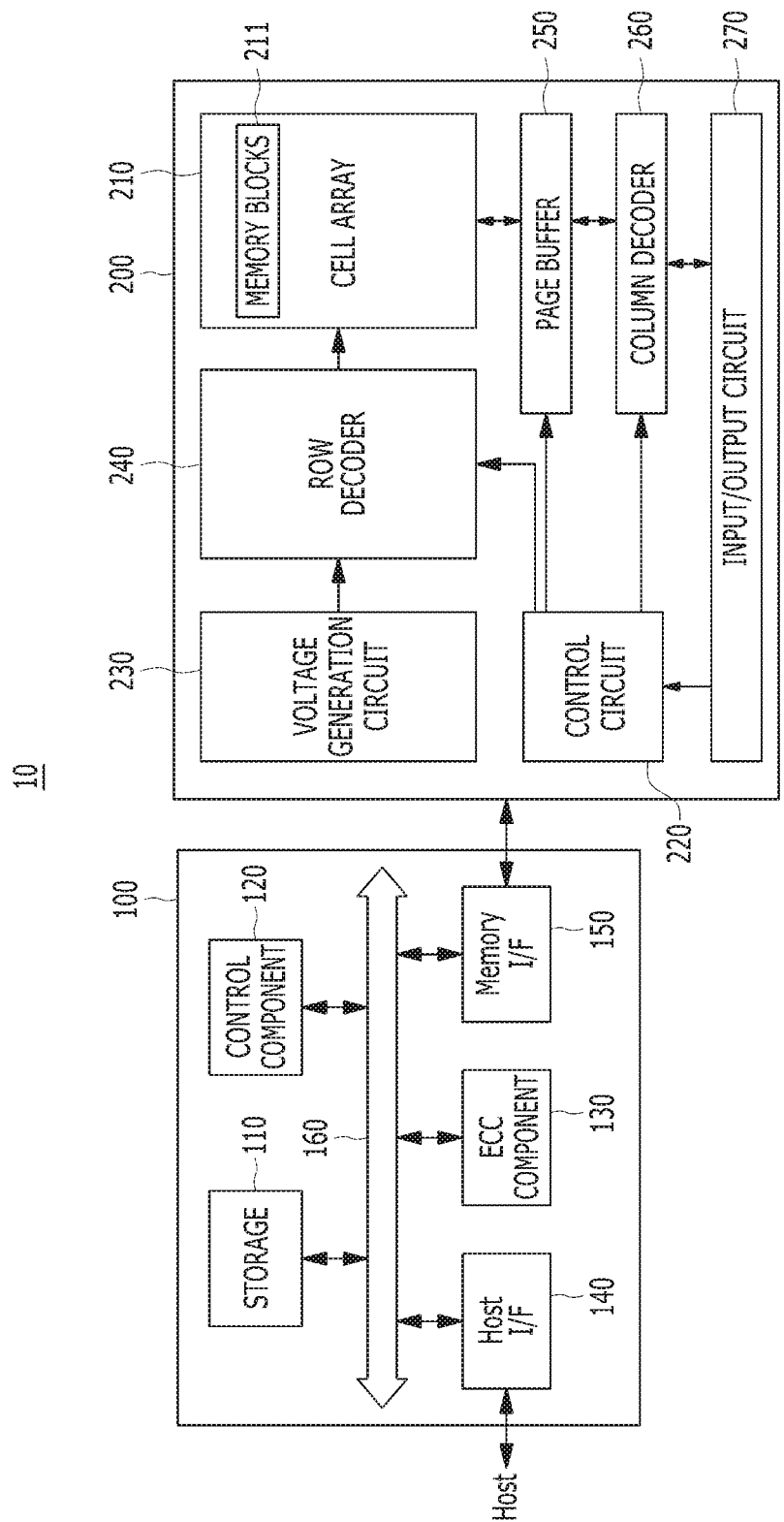
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
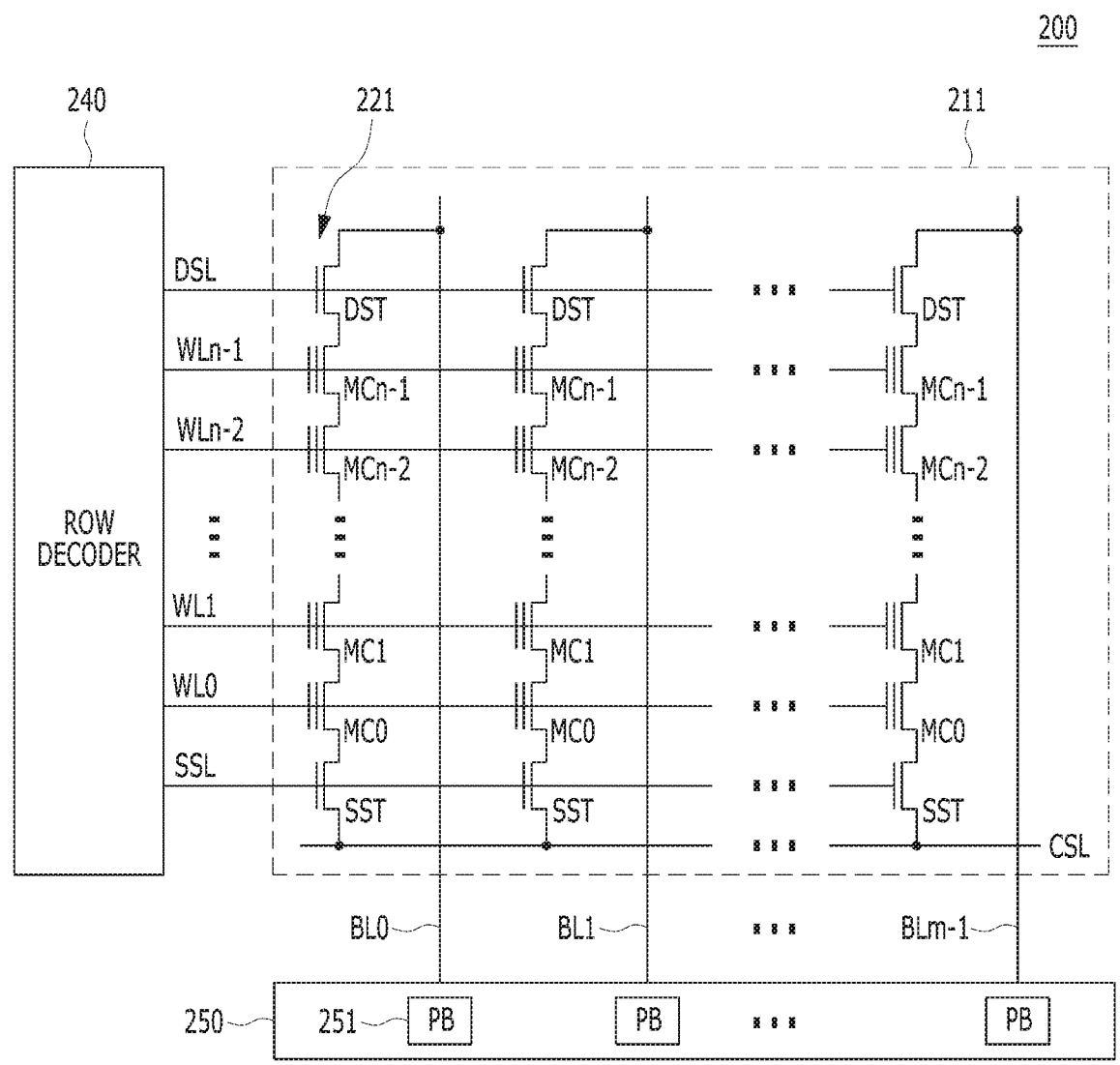
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
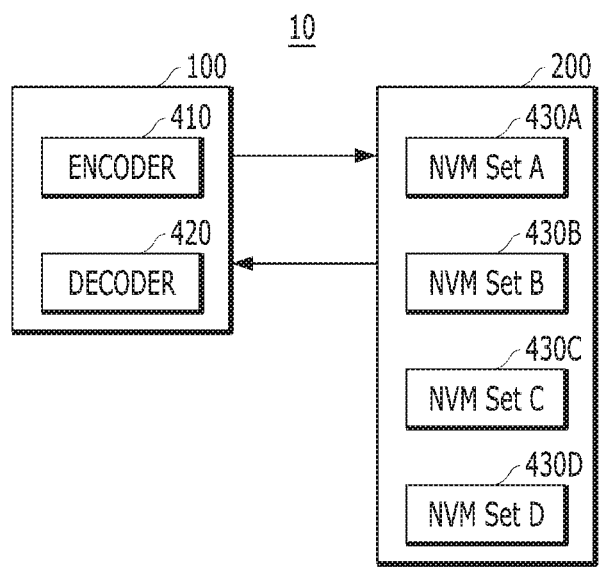
FIG. 4 is a diagram illustrating a memory system in accordance with an embodiment of the present invention.

FIG. 4 is a diagram illustrating a memory system in accordance with an embodiment of the present invention.

Referring to FIG. 4, the memory system may include a controller 100 and a memory device 200. The memory device 200 may include a NAND-type flash memory device with memory cells such as single-level cells (SLCs), multi-level cells (MLCs), triple-level cells (TLCs) or quadruple-level cells (QLCs).

The memory device 200 may include a plurality of memory sets. In some embodiments, the plurality of memory sets may include a plurality of non-volatile memory (NVM) sets, for example, 4 NVM sets 430A to 430D. Each NVM set may be a collection of non-volatile memories (NVMs) that are logically and/or physically separate from NVMs in other NVM sets. One or more namespaces may be created within an NVM set and those namespaces may have the attributes of the NVM set. Each namespace is wholly contained within a single NVM set and does not span more than one NVM set. Each namespace may be a quantity of non-volatile memory that may be formatted into logical blocks. When formatted, a namespace of size n is a collection of logical blocks with logical block addresses from 0 to (n−1). By way of example, each NVM set may include one or more namespaces (NSs) and unallocated (UNA) regions that include NVMs that are not yet allocated to a namespace, as shown in FIG. 5.

Figure 5:
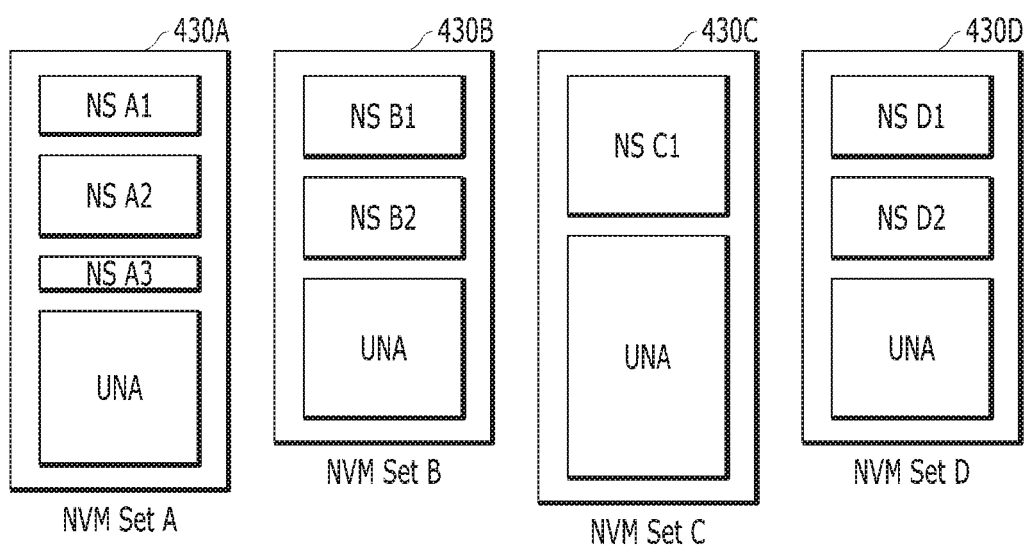
FIG. 5 is a diagram illustrating a plurality of memory sets of a memory device in accordance with an embodiment of the present invention.

Referring to FIG. 5, the NVM set 430A may include a first NS A1, a second NS A2, a third NS A3 and UNA regions. The NVM set 430B may include a first NS B1, a second NS B2 and UNA regions. The NVM set 430C may include a first NS C1 and UNA regions. The NVM set 430D may include a first NS D1, a second NS D2 and UNA regions. The sizes of NSs may be to the same as or different from each other.

Referring back to FIG. 4, the controller 100 may receive a command from a host (e.g., a host 5 of FIG. 1), and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 may transmit read data corresponding to the read command to the host.

The controller 100 may include an encoder 410, and a decoder 420. During the program operation, the encoder 410 may perform an encoding operation on the write data based on a set encoding scheme. During the read operation, the decoder 420 may perform a decoding operation on the read data based on a set decoding scheme corresponding to the encoding scheme. In an embodiment, the encoder 410 and decoder 420 may be embodied in the ECC component 130 of the controller 100 shown in FIG. 2. Other suitable arrangements may be employed as well, as explained below. In general, the encoder 410 and decoder 420 may be implemented by hardware, software, firmware, or any suitable combination thereof.

When retrieving, i.e., reading, data from the memory device 200 to the host, raw data segments (or codewords) from the memory device 200 are processed through an error correction decoding algorithm by the decoder 420 to remove errors of the codewords. When multiple codewords are received from a plurality of NVM sets (e.g., the NVM sets 430A to 430D), the codewords may be decoded by a plurality of decoders (e.g., 4 decoders) as shown in FIG. 6A or a single decoder as shown in FIG. 6B.

Figure 6A:
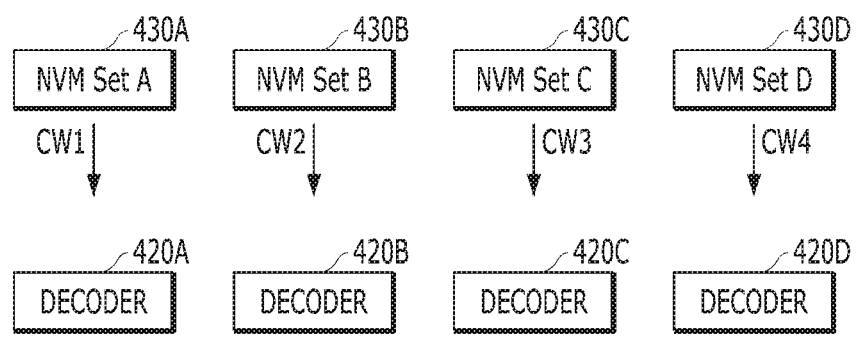
FIGS. 6A and 6B illustrate examples of operations for decoding a plurality of memory sets.

Referring to FIG. 6A, each decoder may receive a codeword CW from the corresponding NVM set. For example, decoder 420A may receive a first codeword CW1 from the NVM set 430A, decoder 420B may receive a second codeword CW2 from the NVM set 430B, decoder 420C may receive a third codeword CW3 from the NVM set 430C and decoder 420D may receive a fourth codeword CW4 from the NVM set 430D. Using separate decoders for each NVM set results in more circuit area and more power consumption in the memory system.

Figure 6B:
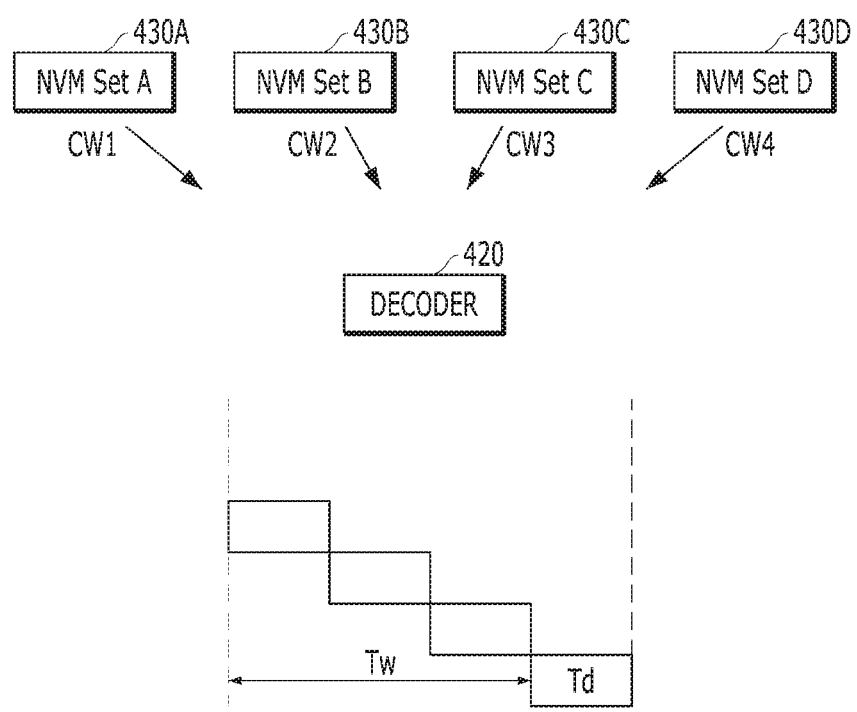

Referring to FIG. 6B, a single decoder 420 may receive multiple codewords CWs from the NVM sets 430A to 430D. For example, the decoder 420 may receive the first codeword CW1 from the NVM set 430A, the second codeword CW2 from the NVM set 430B, the third codeword CW3 from the NVM set 430C and the fourth codeword CW4 from the NVM set 430D. The time it takes for the decoder 420 to decode each codeword may be represented as Td.

If only one NVM set provides a codeword at a time, and other NVM sets remain idle, the total decoding time for a codeword is Td. If four NVM sets provide corresponding codewords to the decoder 420 at the same time, each of the codewords (except the first codeword) needs to wait for all previous codewords to finish decoding. The worst case in the arrangement shown in FIG. 6B is that the last of the 4 codewords needs to wait for the previous 3 codewords to finish decoding. In this case, the last codeword needs to wait an inter-set delay Tw before starting to be decoded. The total decoding time of the last codeword may be calculated as a sum of an inter-set delay Tw and the actual decoding time of the last codeword represented by Td, Tw+Td. The inter-set delay Tw may be used as the measurement of the impact of other NVM sets. In some cases, a maximum inter-set delay requirement, e.g., that imposed in NVM Express Base Specification Revision 1.4, may be exceeded. Accordingly, it is desirable to provide a scheme to use a single decoder to satisfy the maximum inter-set delay requirement for a memory device including a plurality of memory sets (i.e., NVM sets).

Figure 7:
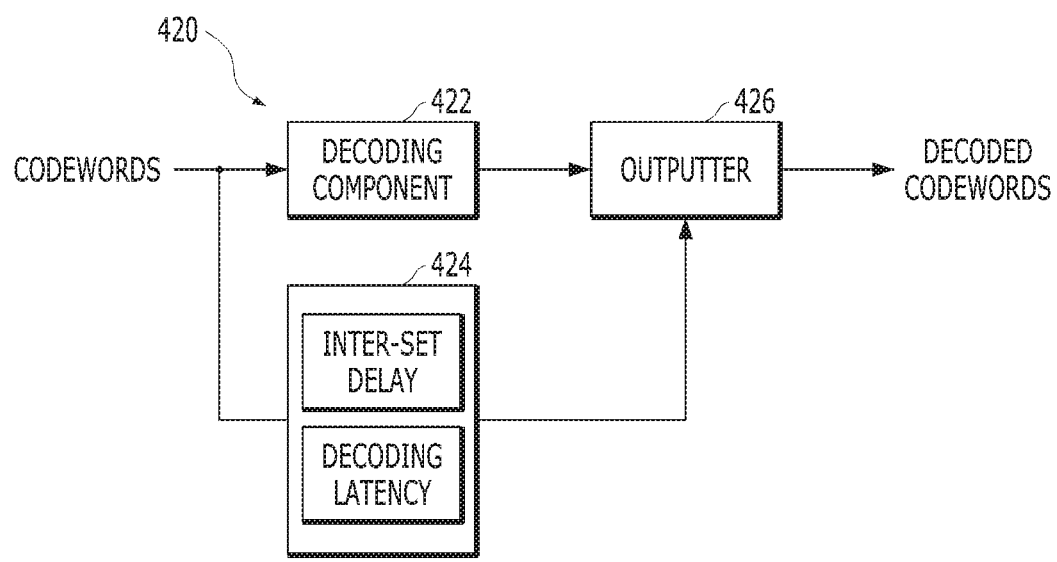
FIG. 7 is a diagram illustrating a decoder in accordance with an embodiment of the present invention.

FIG. 7 is a diagram illustrating the decoder 420 in accordance with an embodiment of the present invention.

Referring to FIG. 7, the decoder 420 may include a decoding component 422, a determiner 424 and an outputter 426. The decoding component 422 may receive multiple codewords from a plurality of memory sets (e.g., NVM sets 430A to 430D of FIG. 4). For example, each of the plurality of memory sets includes multiple namespaces and each namespace includes a plurality of logical blocks. The decoding component 422 may decode the multiple codewords.

In some embodiments, the decoding component 422 may sequentially receive the multiple codewords from the plurality of memory sets in a set order. For example, the decoding component 422 sequentially receives the multiple codewords from the plurality of memory sets in a round-robin scheme.

The determiner 424 may determine an inter-set delay (Tw) for a codeword of a select memory set among the plurality of memory sets. The inter-set delay (Tw) may be a latency from a time that the decoding component 422 starts decoding a codeword from the select memory set in a previous round to a time that the decoding component 422 starts decoding the next codeword from the select memory set in a current round. Further, the determiner 424 may determine a decoding time (Td) and a total decoding time, which includes Tw.

When the inter-set delay (Tw) is greater than a maximum inter-set delay (Tw_max), the determiner 424 may determine a total decoding time based on an effective inter-set delay (Tw') and an effective decoding time (Td'). In this instance, the total decoding time is determined as a sum (Tw'+Td') of the effective inter-set delay (Tw') and the effective decoding time (Td'). When the inter-set delay (Tw) is less than or equal to the maximum inter-set delay (Tw_max), the decoding component 422 may determine the total decoding time based on the inter-set delay (Tw) and a decoding time (Td) associated with the decoding of successive codewords of a given memory set. In this instance, the total decoding time is determined as a sum (Tw+Td) of the inter-set delay (Tw) and the decoding time (Td).

In some embodiments, the set value (Th) is the same as the difference value (x) between the actual maximum inter-set delay (Tw_max') and the allowed/specification-required/client-required maximum inter-set delay (Tw_max) when the actual inter-set delay (Tw) is greater than or equal to the difference value (x), and the set value (Th) is determined as zero when the actual inter-set delay (Tw) is less than the difference value (x).

In some embodiments, the effective inter-set delay (Tw') is determined as the difference (Tw-Th) between the actual inter-set delay (Tw) and the set value (Th), and the effective decoding time (Td') is determined as the sum of (Td+Th) between the decoding time (Td) and the set value (Th).

The outputter 426 may receive a decoded codeword from the decoding component 422 and output the decoded codeword at the end of the total decoding time. In some embodiments, the outputter 426 may output the decoded codeword in response to the data valid signal, which is generated at the end of the total decoding time.

Figure 8:
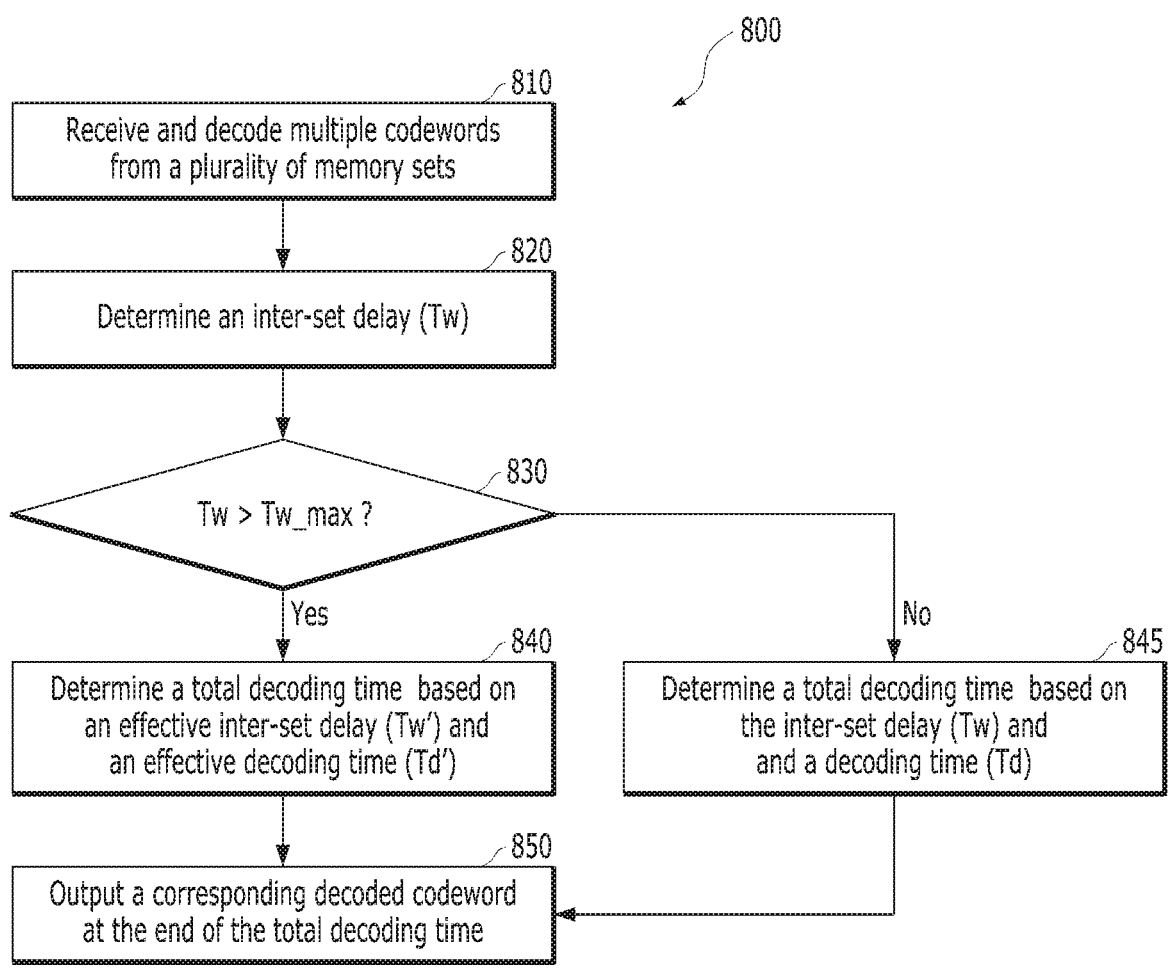
FIG. 8 is a flowchart illustrating an operation of a decoder in accordance with an embodiment of the present invention.

FIG. 8 is a flowchart illustrating an operation 800 of a decoder in accordance with an embodiment of the present invention. The operation 800 may be performed by components 422, 424 and 426 of the decoder 420 in FIG. 7.

Referring to FIG. 8, the operation 800 may include steps 810 to 850. At step 810, the decoder 420 may receive multiple codewords from a plurality of memory sets (e.g., NVM sets 430A to 430D of FIG. 4). For example, each of the plurality of memory sets includes multiple namespaces and each namespace includes a plurality of logical blocks. Further, at step 810, the decoder 420 may decode the multiple codewords.

In some embodiments, the decoder 420 may sequentially receive the multiple codewords from the plurality of memory sets in a set order. For example, the decoder 420 sequentially receives the multiple codewords from the plurality of memory sets in a round-robin scheme.

At step 820, the decoder 420 may determine an inter-set delay (Tw) for a corresponding codeword of a select memory set among the plurality of memory sets. The inter-set delay (Tw) may be a latency from a time that the decoding component 422 starts decoding a codeword for the select memory set in a previous round to a time that the decoding component 422 starts decoding the next codeword for the select memory set in a current round.

At step 830, the decoder 420 may compare the inter-set delay (Tw) with a set maximum inter-set delay (Tw_max).

When the inter-set delay (Tw) is greater than the maximum inter-set delay (Tw_max) (5830, YES), the decoder 420 may determine a total decoding time based on an effective inter-set delay (Tw') and an effective decoding time (Td') at step 840. For example, the total decoding time is determined as a sum (Tw'+Td') of the effective inter-set delay (Tw') and the effective decoding time (Td').

When the inter-set delay Tw is greater than the set maximum inter-set delay Tw_max (5830, NO), the decoder 420 may determine the total decoding time based on the inter-set delay (Tw) and a decoding time (Td) associated with the decoding of the decoded codeword at step 845. For example, the total decoding time is determined as a sum (Tw+Td) of the effective inter-set delay (Tw) and the effective decoding time (Td).

In some embodiments, the set value (Th) is the same as the difference value (x) between the actual maximum inter-set delay (Tw_max') and the allowed/specification-required/client-required maximum inter-set delay (Tw_max) when the actual inter-set delay (Tw) is greater than or equal to the difference value (x), and the set value (Th) is determined as zero when the actual inter-set delay (Tw) is less than the difference value (x).

In some embodiments, the effective inter-set delay (Tw') is determined as the difference (Tw-Th) between the actual inter-set delay (Tw) and the set value (Th), and the effective decoding time (Td') is determined as the sum of (Td+Th) between the decoding time (Td) and the set value (Th).

At step 850, the decoder 420 may output a decoded codeword at the end of the total decoding time. In some embodiments, the outputter 426 may output the decoded codeword in response to the data valid signal, which is generated at the end of the total decoding time.

Figure 9:
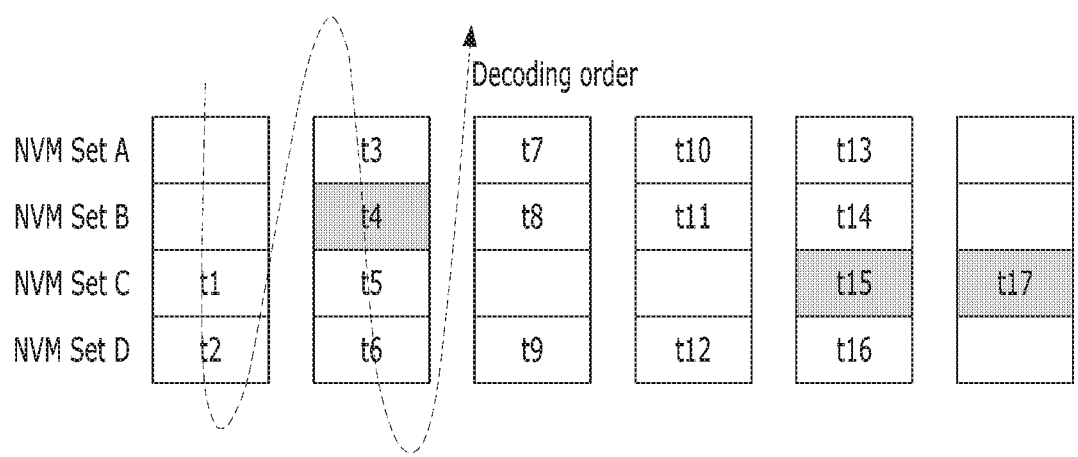
FIG. 9 is a diagram illustrating a decoding process of a decoder in accordance with an embodiment of the present invention.

FIG. 9 is a diagram illustrating a decoding process of a decoder in accordance with an embodiment of the present invention. The decoding process of FIG. 9 may be performed by the decoding component 422 of the decoder 420 in FIG. 7.

Referring to FIG. 9, the decoding component 422 may receive (or pick up) codewords in a set order (e.g., the order in the round-robin scheme), from a plurality of memory sets, for example, 4 NVM sets 430A to 430D as shown. When a certain set has no codeword available, the decoding component 422 skips that set this time and comes back to it next time (or round).

In FIG. 9, "tx" represents that there is a codeword "x" waiting to be decoded, and that it takes tx to decode codeword x. Each empty box represents that there is no codeword to be decoded at the corresponding time. The arrow indicates the order in which the decoding component 422 checks read buffers of the NVM sets 430A to 430D.

In order to calculate an inter-set delay Tw for a codeword, the decoding component 422 may record the latency from the time that the decoder 420 checked a set in a previous round to the time that the decoder 420 starts decoding a codeword in that set in a current round. For example, the actual decoding delay of codeword 4 is Tw=t1+t2+t3; the actual decoding delay of codeword 15 is Tw=t12+t13+t14; and the actual decoding delay of codeword 17 is Tw=t16.

Figure 10:
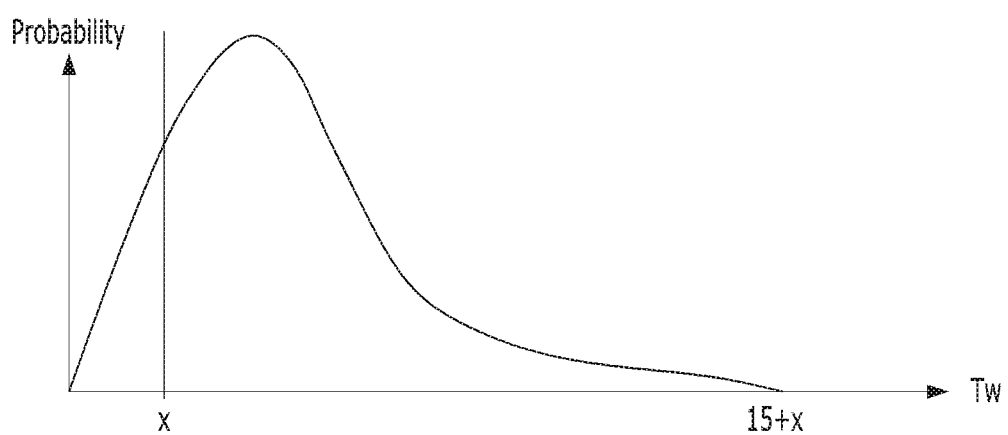
FIG. 10 is a graph illustrating a probability distribution of an inter-set delay for each codeword.

FIG. 10 is a graph illustrating a probability distribution of an inter-set delay Tw for each codeword.

Referring to FIG. 10, x-axis represents an inter-set delay Tw (e.g., few microseconds (us)) for each codeword) and y-axis represents a probability distribution of the inter-set delay Tw. In other words, FIG. 10 shows a probability distribution of the inter-set delay Tw. It is assumed that the maximum inter-set delay allowed Tw_max is 15 us. Thus, the inter-set delay Tw is to be maintained less than or equal to the maximum inter-set delay Tw_max. However, in some cases, the inter-set delay Tw may exceed Tw_max, as shown in FIG. 10. In FIG. 10, the inter-set delay Tw is greater than the maximum inter-set delay Tw_max (15 in FIG. 10) by a difference value x.

In some embodiments, in order to use a single decoder to satisfy the inter-set delay requirement in a particular condition (e.g., when an actual inter-set delay Tw is greater than an allowable maximum inter-set delay Tw_max), a total decoding time of the decoder 420 may be determined based on an effective inter-set delay Tw' and an effective decoding time Td'. Otherwise, the total decoding time may be determined based on the actual inter-set delay Tw and an actual decoding time Td.

In the particular condition, the total decoding time may be determined as a sum (Tw'+Td') of an effective inter-set delay Tw' and an effective decoding time Td'. The effective decoding latency Td' may be determined as a sum (Th+Td) of an actual decoding time Td and a set delay value Th.

When the actual inter-set delay Tw follows the probability distribution in FIG. 10, the set delay value Th may be determined as shown in Equation 1.

$Th=x$ if $Tw \geq x$;

$Th=0$ otherwise.                    Equation 1:

In Equation 1, the set value (Th) is determined to be the same as the difference value (x) when the inter-set delay (Tw) is greater than or equal to the difference value (x). The set value (Th) is determined to be zero (0) when the inter-set delay (Tw) is less than the difference value (x).

The effective inter-set delay Tw' may be determined as shown in Equation 2.

$Tw'=Tw$ if $Tw<x$;

$Tw'=Tw-Th$ otherwise.                Equation 2:

In Equation 2, the effective inter-set delay (Tw') is determined to be the same as the inter-set delay (Tw) when the inter-set delay (Tw) is less than a difference value (x) between the actual inter-set delay (Tw) and the set maximum inter-set delay (Tw_max). The effective inter-set delay (Tw') is determined as the difference value (x) between the inter-set delay Tw and a set value (Th) when the inter-set delay (Tw) is greater than or equal to the difference value (x).

Figure 11:
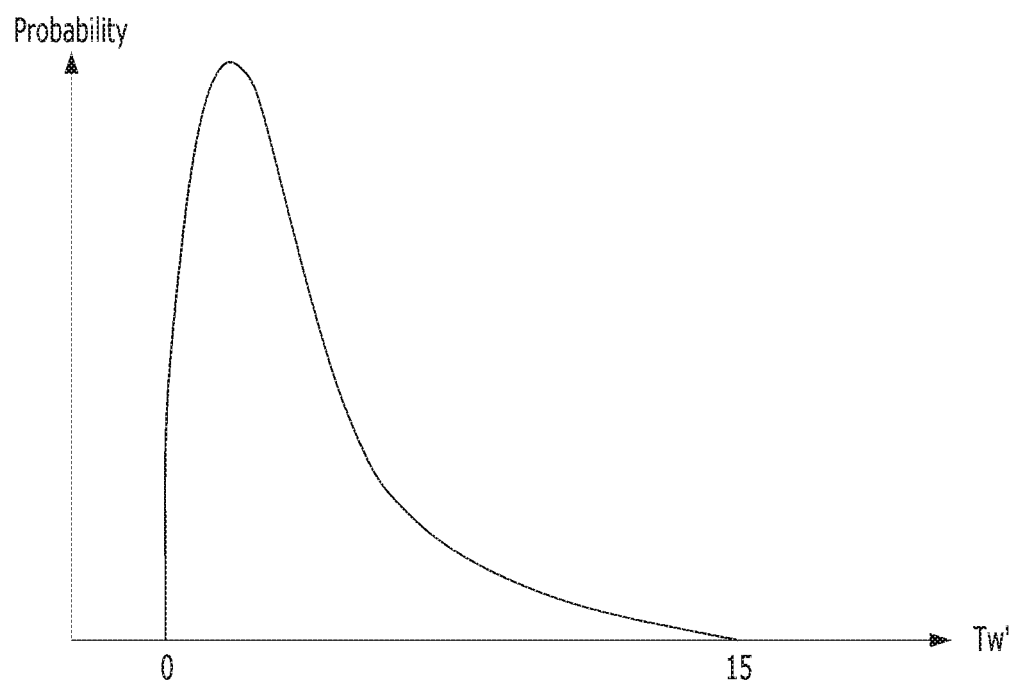
FIG. 11 is a graph illustrating a probability distribution of an effective inter-set delay in accordance with an embodiment of the present invention.

By way of example as shown in FIG. 10, if the actual inter-set delay Tw=15+x, then Th=x, Tw'=15, and Td'=Th+Td=x+Td. When the actual inter-set delay Tw is greater than or equal to the difference value (x), FIG. 11 illustrates the probability of the effective inter-set delay Tw'. Comparing with FIG. 10, the distribution of FIG. 11 is on the right side of a vertical line representing a value of 0 and the actual inter-set delay Tw does not violate the allowable maximum inter-set delay 15[us], i.e., the inter-set delay requirement is satisfied.

As described above, embodiments use a single decoder for multiple memory sets (i.e., NVM sets) and determine a total decoding time of the decoder in a particular condition, based on an effective inter-set delay and an effective decoding latency, instead of an actual inter-set delay and an actual decoding latency. Thus, the embodiments satisfy the inter-set delay requirement in the particular condition, thus reducing circuit area and power consumption compared to using multiple decoders.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
   a memory device including a plurality of memory sets; and
   a controller including a decoder configured to:
   receive multiple codewords from the plurality of memory sets;
   decode the multiple codewords;
   determine an inter-set delay for a codeword of a select memory set;
   when the inter-set delay is greater than a maximum inter-set delay,
   determine a total decoding time based on an effective inter-set delay and an effective decoding latency; and
   output the decoded codeword at the end of the total decoding time,
   wherein each of the plurality of memory sets includes multiple namespaces, each namespace including a plurality of logical blocks.

2. The memory system of claim 1, wherein the inter-set delay includes a latency from a time that the decoder starts decoding for the select memory set in a previous round to a time that the decoder starts decoding for the select memory set in a current round.

3. The memory system of claim 1, wherein the decoder outputs the decoded codeword in response to a data valid signal, which is generated at the end of the total decoding time.

4. The memory system of claim 1, wherein, when the inter-set delay is less than or equal to the maximum inter-set delay, the decoder determines the total decoding time based on the inter-set delay and a decoding time associated with the decoding of the codeword.

5. The memory system of claim 1, wherein the decoder sequentially receives the multiple codewords from the plurality of memory sets in a set order.

6. The memory system of claim 5, wherein the set order is an order of a round-robin scheme.

7. The memory system of claim 1, wherein the effective inter-set delay is determined as the difference between the inter-set delay and a set value, and the effective decoding latency is determined as the sum of the decoding time and the set value.

8. The memory system of claim 7, wherein the set value is the same as the difference value between an actual maximum inter-set delay and an allowed maximum inter-set delay when the inter-set delay is greater than or equal to the difference value, and the set value is determined as zero when the inter-set delay is less than the difference value.

9. A method for operating a decoder comprising:
receiving multiple codewords from a plurality of memory sets;
decoding the multiple codewords;
determining an inter-set delay for a codeword of a select memory set;
when the inter-set delay is greater than a maximum inter-set delay, determining a total decoding time based on an effective inter-set delay and an effective decoding latency; and
outputting the decoded codeword at the end of the total decoding time,
wherein each of the plurality of memory sets includes multiple namespaces, each namespace including a plurality of logical blocks.

10. The method of claim 9, wherein the inter-set delay includes a latency from a time that the decoder starts decoding for the select memory set in a previous round to a time that the decoder starts decoding for the select memory set in a current round.

11. The method of claim 9, wherein the outputting of the decoded codeword includes outputting the decoded codeword in response to a data valid signal, which is generated at the end of the total decoding time.

12. The method of claim 9, wherein the determining of the total decoding time includes determining the total decoding time based on the inter-set delay and a decoding time associated with the decoding of the codeword when the inter-set delay is less than or equal to the maximum inter-set delay.

13. The method of claim 9, wherein the decoding of the multiple codewords includes sequentially receiving the multiple codewords from the plurality of memory sets in a set order.

14. The method of claim 13, wherein the set order is an order of a round-robin scheme.

15. The method of claim 9, further comprising:
determining the effective inter-set delay as the difference between the inter-set delay and a set value, and
determining the effective decoding latency is determined as the sum of the decoding time and the set value.

16. The method of claim 15, further comprising:
determining the set value as the difference value between an actual maximum inter-set delay and an allowed maximum inter-set delay when the inter-set delay is greater than or equal to the difference value, and
determining the set value as zero when the inter-set delay is less than the difference value.

* * * * *